US008299685B2

(12) United States Patent
Cho et al.

(10) Patent No.: US 8,299,685 B2
(45) Date of Patent: Oct. 30, 2012

(54) HIGH POWER ULTRASONIC TRANSDUCER

(75) Inventors: Kyung-il Cho, Seoul (KR); Jong-keun Song, Yongin-si (KR); Dong-wook Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 206 days.

(21) Appl. No.: 12/796,085

(22) Filed: Jun. 8, 2010

(65) Prior Publication Data

US 2011/0057541 A1 Mar. 10, 2011

(30) Foreign Application Priority Data

Sep. 4, 2009 (KR) ........................ 10-2009-0083515

(51) Int. Cl.
*H01L 41/08* (2006.01)

(52) U.S. Cl. ........................................ 310/334; 310/324

(58) Field of Classification Search ................... 310/334
See application file for complete search history.

(56) References Cited

U.S. PATENT DOCUMENTS

| | | | | |
|---|---|---|---|---|
| 4,373,143 | A * | 2/1983 | Lindberg | 310/334 |
| 4,633,119 | A * | 12/1986 | Thompson | 310/325 |
| 4,950,936 | A * | 8/1990 | Rynne et al. | 310/337 |
| 5,515,342 | A * | 5/1996 | Stearns et al. | 367/155 |
| 5,726,952 | A * | 3/1998 | Eckert et al. | 367/140 |
| 6,314,057 | B1 | 11/2001 | Solomon | |
| 8,120,229 | B2 * | 2/2012 | Huang | 310/309 |
| 2005/0121734 | A1 | 6/2005 | Degertekin et al. | |
| 2007/0228878 | A1 | 10/2007 | Huang | |
| 2008/0194053 | A1 | 8/2008 | Huang | |
| 2008/0197751 | A1 * | 8/2008 | Huang | 310/311 |
| 2009/0122651 | A1 * | 5/2009 | Kupnik et al. | 367/181 |
| 2009/0250729 | A1 * | 10/2009 | Lemmerhirt et al. | 257/254 |

FOREIGN PATENT DOCUMENTS

| | | | |
|---|---|---|---|
| JP | 2004-350704 | A | 12/2004 |
| JP | 2006-020313 | A | 1/2006 |
| KR | 1020060071304 | A | 6/2006 |
| KR | 1020070085552 | A | 8/2007 |

* cited by examiner

*Primary Examiner* — Mark Budd

(74) *Attorney, Agent, or Firm* — Cantor Colburn LLP

(57) ABSTRACT

A high power ultrasonic transducer includes a first ultrasonic transducer cell and at least one second ultrasonic transducer cell disposed on the first ultrasonic transducer cell. The at least one second ultrasonic transducer cell oscillates together with the first ultrasonic transducer cell.

24 Claims, 7 Drawing Sheets

HIGH POWER ULTRASONIC TRANSDUCER

CROSS-REFERENCE TO RELATED APPLICATION

This application claims priority to Korean Patent Application No. 10-2009-0083515, filed on Sep. 4, 2009, and all the benefits accruing therefrom under 35 U.S.C. §119, the content of which in its entirety is herein incorporated by reference.

BACKGROUND

1) Field

The general inventive concept relates to high power ultrasonic transducers and, more particularly, the general inventive concept relates to high power ultrasonic transducers having substantially improved ultrasonic transmission power, for example.

2) Description of the Related Art

Capacitive micromachined ultrasonic transducers ("CMUTs") are typically used to transmit and receive ultrasonic waves using a displacement variation of hundreds or thousands of oscillating membranes microprocessed on a silicon wafer. CMUTs may include a silicon wafer, such as is used in a general semiconductor process, a thin film that has a thickness of thousands of angstroms (Å) and is disposed on the silicon wafer, and a cavity of thousands of angstroms (Å) formed between the thin film and the silicon wafer. The silicon wafer and the thin film form a capacitor and have a vacuum therebetween. When alternating current ("AC") flows through the capacitor, the thin film oscillates, and the CMUTs thereby generate ultrasonic waves.

SUMMARY

Provided are ultrasonic transducers having substantially improved ultrasonic transmission power.

Additional aspects will be set forth in part in the description which follows and, in part, will be apparent from the description, or may be learned by practice of the general inventive concept.

According to an aspect of the present invention, an ultrasonic transducer includes a first ultrasonic transducer cell, and at least one second ultrasonic transducer cell disposed on the first ultrasonic transducer cell, where the at least one second ultrasonic transducer cell oscillates together with the first ultrasonic transducer cell.

According to an aspect of the present invention, an area of a horizontal cross-section of the at least one second ultrasonic transducer cell may be less than an area of a horizontal cross-section of the first ultrasonic transducer cell.

According to an aspect of the present invention, the first ultrasonic transducer cell may include: a substrate; a first thin film disposed opposite the substrate; a first support portion disposed between the substrate and the first thin film; and a first cavity formed between the substrate and the first thin film.

According to an aspect of the present invention, the at least one second ultrasonic transducer cell may include a second thin film disposed opposite the first thin film of the first ultrasonic transducer cell, a second support portion disposed between the first thin film of the first ultrasonic transducer cell and the second thin film and a second cavity formed between the first thin film of the first ultrasonic transducer cell and the second thin film.

According to an aspect of the present invention, the at least one second ultrasonic transducer cell may be disposed on the first thin film of the first ultrasonic transducer cell and not overlapping the first support portion.

According to an aspect of the present invention, the ultrasonic transducer may further include at least one third ultrasonic transducer cell disposed adjacent to the at least one second ultrasonic transducer cell and a third cavity formed in the at least one third ultrasonic transducer cell, where the at least one third ultrasonic transducer cell is disposed on the first thin film of the first ultrasonic transducer cell and overlapping the first support portion.

According to an aspect of the present invention, the first cavity may be used to transmit ultrasonic waves, and the second cavity and the third cavity may be used to transmit and receive ultrasonic waves.

According to an aspect of the present invention, the first ultrasonic transducer cell and the second ultrasonic transducer cell may transmit ultrasonic waves when alternating current ("AC") voltages are applied to the first ultrasonic transducer cell and the second ultrasonic transducer cell in a state where the first ultrasonic transducer cell and the at least one second ultrasonic transducer cell receive direct current ("DC") voltages.

According to an aspect of the present invention, ultrasonic waves may be received by the at least one second ultrasonic transducer cell and the third ultrasonic transducer cell when a DC voltage is applied to the at least one second ultrasonic transducer cell and the at least one third ultrasonic transducer cell.

According to an aspect of the present invention, when voltages are applied to the first ultrasonic transducer cell and the at least one second ultrasonic transducer cell, a voltage applied to the first ultrasonic transducer cell may be greater than a voltage applied to the at least one second ultrasonic transducer cell.

According to an aspect of the present invention, the at least one second ultrasonic transducer cell and the at least one third ultrasonic transducer cell ultrasonic receive ultrasonic waves when a DC voltage greater than a collapse mode voltage is applied to the first ultrasonic transducer cell.

According to an aspect of the present invention, the ultrasonic transducer may further include an oscillation amplifying unit disposed in the second cavity, where the oscillation amplifying unit oscillates together with the first thin film of the at least one second ultrasonic transducer cell when ultrasonic waves are transmitted.

According to an aspect of the present invention, a resonance frequency of the at least one second ultrasonic transducer cell may have be higher than a resonance frequency of the first ultrasonic transducer cell, and at least a portion of a frequency band of the at least one second ultrasonic transducer cell may be included in a frequency band of the first ultrasonic transducer cell.

According to an aspect of the present invention, a resonance frequency of the at least one second ultrasonic transducer cell may be one of substantially the same as a resonance frequency of the first ultrasonic transducer cell, twice higher than the resonance frequency of the first ultrasonic transducer cell and three times higher than the resonance frequency of the first ultrasonic transducer cell.

According to another aspect of the present invention, the ultrasonic transducer includes a substrate, a first thin film disposed opposite the substrate, a plurality of first support portions disposed between the substrate and the first thin film, a plurality of first cavities formed between the substrate and the first thin film, an second thin film disposed opposite the first thin film, a plurality of second support portions disposed between the first thin film and the second thin film, and a plurality of second cavities formed between the first thin film and the second thin film, where ultrasonic waves are transmitted when an AC voltage is applied in a state where DC voltages are applied to the plurality of first cavities and the plurality of second cavities.

According to an aspect of the present invention, an area of horizontal cross-section of each of the second cavities may be less than an area of horizontal cross-section of each of the first cavities.

According to an aspect of the present invention, each second cavity of the plurality of second cavities may transmit and receive ultrasonic waves.

According to an aspect of the present invention, ultrasonic waves may be received by the plurality of second cavities when a DC voltage is applied to the plurality of second cavities.

According to an aspect of the present invention, ultrasonic waves may be received by the plurality of second cavities when a DC voltage greater than a collapse mode voltage is applied to the plurality of first cavities.

According to an aspect of the present invention, at least one second cavity of the plurality of second cavities may overlap the plurality of first cavities and does not cover the plurality of first support portions.

According to an aspect of the present invention, the ultrasonic transducer may further include an oscillation amplifying unit disposed in at least one second cavity of the plurality of second cavities and which oscillates together with the first thin film when ultrasonic waves are transmitted.

According to an aspect of the present invention, a first electrode may be disposed above the substrate, a second electrode may be disposed below the first thin film, a third electrode may be disposed above the first thin film, a fourth electrode may be disposed below the second thin film, and the second electrode and the third electrode may be common ground electrodes.

According to an aspect of the present invention, when voltages are applied to the plurality of first cavities and the plurality of second cavities, a voltage applied to each first cavity of the plurality of first cavities may be greater than a voltage applied to each second cavity of the plurality of second cavities.

According to an aspect of the present invention, a resonance frequency of the second thin film may be higher than a resonance frequency of the first thin film, and at least a portion of a frequency band of the second thin film may be included in a frequency band of the first thin film.

According to an aspect of the present invention, a resonance frequency of the at least one second thin film may be one of substantially the same as a resonance frequency of the first ultrasonic transducer cell, twice higher than the resonance frequency of the first ultrasonic transducer cell and three times higher than the resonance frequency of the first thin film.

BRIEF DESCRIPTION OF THE DRAWINGS

The above and/or other aspects of this disclosure will become more apparent describing in further detail embodiments thereof with reference to the accompanying drawings, in which.

DETAILED DESCRIPTION

Figure 1:
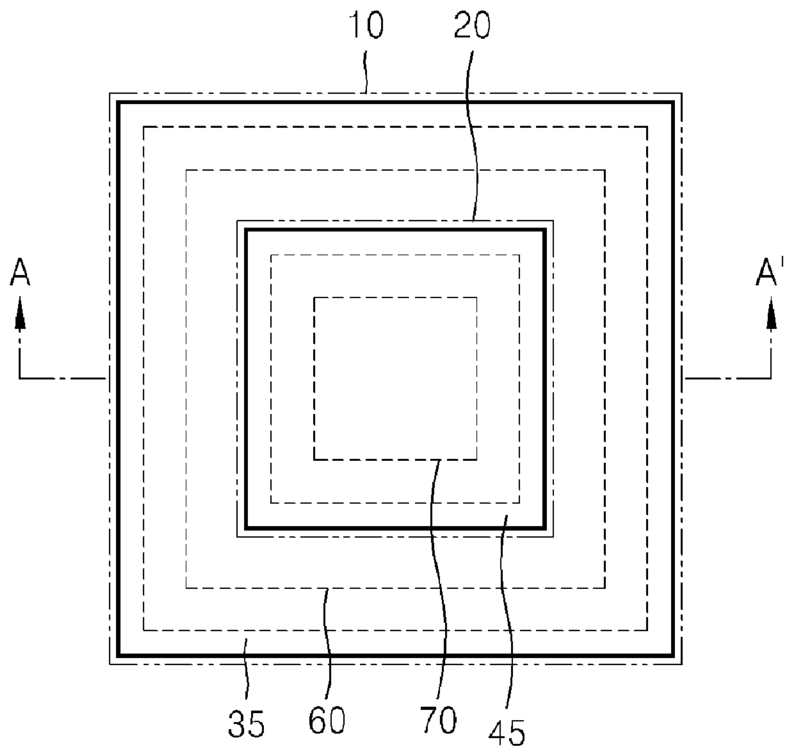
FIG. 1 is a plan view of an embodiment of an ultrasonic transducer.

The general inventive concept now will be described more fully hereinafter with reference to the accompanying drawings, in which various example embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated regions, integers, steps, operations, elements, and/or components, but do not preclude the presence or addition of one or more other regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

One or more embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear portions. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view of an embodiment of an ultrasonic transducer. As shown in FIG. 1, the ultrasonic transducer includes a first ultrasonic transducer cell 10 and at least one second ultrasonic transducer cell 20 disposed on the first ultrasonic transducer cell 10. In an embodiment, the ultrasonic transducer may have a two-layer structure in which the second ultrasonic transducer cell 20 is disposed, e.g., stacked, on the first ultrasonic transducer cell 10. In an embodiment, the first ultrasonic transducer cell 10 transmits ultrasonic waves, and the second ultrasonic transducer cell 20 receives ultrasonic waves. In another embodiment, the second ultrasonic transducer cell 20 transmits and receives ultrasonic waves. The second ultrasonic transducer cell 20 may be connected to, e.g., coupled with, the first ultrasonic transducer cell 10 and oscillate together with the first ultrasonic transducer cell 10 to increase ultrasonic transmission power of the first ultrasonic transducer cell 10 when an ultrasonic is transmitted. In an embodiment, an area of the horizontal cross-section of the second ultrasonic transducer cell 20 is be less than an area of the horizontal cross-section of the first ultrasonic transducer cell 10, and the horizontal cross-section of the second ultrasonic transducer cell 20 may overlap, e.g., be included within, the horizontal cross-section of the first ultrasonic transducer cell 10.

Figure 2:
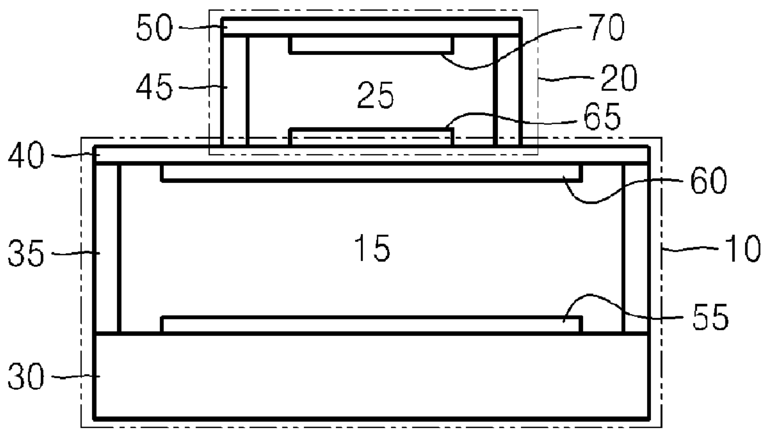
FIG. 2 is a cross-sectional view taken along line A-A' of FIG. 1.

FIG. 2 is a cross-sectional view taken along line A-A' of FIG. 1. As shown in FIG. 2, the first ultrasonic transducer cell 10 includes a substrate 30, a first thin film 40 and a first cavity 15 formed between the substrate 30 and the first thin film 40. A first support portion 35 is disposed between the substrate 30 and the first thin film 40, e.g., is provided as a side wall of the first cavity 15. In an embodiment, the substrate 30 and the first support portion 35 are integrally formed with each other or, alternatively, the first thin film 40 and the first support portion 35 may be integrally formed with each other. The first ultrasonic transducer cell includes the first cavity 15 that transmits ultrasonic waves. A first electrode 55 may be disposed on, e.g., above or below, the substrate 30 and a second electrode 60 may be disposed on, e.g., above or below, the first thin film 40. The first cavity 15 has an electrode gap between the first electrode 55 and the second electrode 60 to increase ultrasonic transmission power. In an embodiment, when the first ultrasonic transducer cell transmits ultrasonic waves and the second ultrasonic transducer cell receives ultrasonic waves, the electrode gap of the first cavity 15 that transmits ultrasonic waves is greater than an electrode gap of a second cavity 25 that receives ultrasonic waves. A shape of the first cavity 15, in horizontal cross-section, may be rectangular, e.g., a square, as shown in FIG. 1, but is not limited thereto. In another embodiment, the shape of the first cavity 15, in horizontal cross-section, may be a circle, a hexagon or an octagon, for example.

The second ultrasonic transducer cell 20 includes the first thin film 40, a second thin film 50 and the second cavity 25 formed between the first thin film 40 and the second thin film 50. The second ultrasonic transducer cell 20 may be disposed on the first ultrasonic transducer cell 10, e.g., on a top surface of the first ultrasonic transducer cell 10, and does not cover the first support portion 35. A second support portion 45 may be disposed between the first thin film 40 and the second thin film 50, e.g., be provided as a side wall of the second cavity 25. In an embodiment, the first thin film 40 and the second support portion 45 are integrally formed with each other or, alternatively, the second thin film 50 and the second support portion 45 may be integrally formed with each other. In an embodiment, the first and second transducer cells 10 and 20 may share the first thin film 40. In another embodiment, the first thin film 40 may have two layers included in the first and second transducer cells 10 and 20, respectively. In an embodiment, the second ultrasonic transducer cell 20 includes the second cavity 25 that receives ultrasonic waves. In another embodiment, the second cavity 25 may also transmit ultrasonic waves. A third electrode 65 may be disposed on, e.g., over or below, the first thin film 40 and a fourth electrode 70 may be disposed on, e.g., over or below, the second thin film 50. The second electrode 60 and the third electrode 65 may be used as common ground electrodes. In an embodiment, an insulating layer may be disposed between the second electrode 60 and the third electrode 65. The second cavity may include an electrode gap between the third electrode 65 and the fourth electrode 70. The electrode gap of the second cavity 25 may be predetermined to thereby increase ultrasonic reception sensitivity. In an embodiment, when the first ultrasonic transducer cell transmits ultrasonic waves and the second ultrasonic transducer cell receives ultrasonic waves, the electrode gap of the second cavity 25 that receives ultrasonic waves may be less than the electrode gap of the first cavity 15 that transmits ultrasonic waves. A shape of the second cavity 25, in horizontal cross-section, may be a rectangle, e.g., a square, as shown in FIG. 1, but is not limited thereto. In another embodiment, the shape of the second cavity 25, in horizontal cross-section, may be a circle, a hexagon or an octagon, for example.

In an embodiment, the second ultrasonic transducer cell 20 may be connected to, e.g., coupled with, the first ultrasonic transducer cell 10 and oscillate together with the first ultrasonic transducer cell 10. The area of the horizontal cross-section of the cavity of the first ultrasonic transducer cell 10 may be greater than the area of the horizontal-cross section of the cavity of the second ultrasonic transducer cell 20, and the second ultrasonic transducer cell 20 thereby efficiently oscillate together with the first ultrasonic transducer cell 10.

When alternating current ("AC") voltages are applied to the first and second ultrasonic transducer cells 10 and 20 in a state where direct current ("DC") voltages are applied to the first and second ultrasonic transducer cells 10 and 20, respectively, ultrasonic waves are transmitted. When the DC or the AC voltages are applied to the first and second ultrasonic transducer cells 10 and 20, the voltage applied to the first ultrasonic transducer cell 10 may be greater than the voltage applied to the second ultrasonic transducer cell 20. An ultrasonic transmission principle of the first ultrasonic transducer cell 10 will now be described in further detail. When a DC voltage is applied to the first and second electrodes 55 and 60 of the first ultrasonic transducer cell 10, the substrate 30 and the first thin film 40 form a capacitor. When the DC voltage is applied between the first electrode 55 and the second electrode 60, the first thin film 40 is displaced due to an electrostatic force generated between the second electrode 60 and the first electrode 55 and that attracts the second electrode 60 and the first electrode 55 toward each other. The first thin film 40 is displaced to a position where the electrostatic force and the internal stress of the first thin film 40 are equivalent to each other. When an AC voltage is applied in the state, the first thin film 40 oscillates, and the first ultrasonic transducer cell 10 thereby generates ultrasonic waves. An ultrasonic transmission principle of the second ultrasonic transducer cell 20 is substantially the same as the ultrasonic transmission principle of the first ultrasonic transducer cell 10. In an embodiment, when the second ultrasonic transducer cell 20 is connected to, e.g., coupled with, the first ultrasonic transducer cell 10 and oscillate together during an ultrasonic transmission operation, ultrasonic transmission power of the ultrasonic transducer is substantially increased. In an embodiment, AC voltages for transmitting ultrasonic waves may be applied to the first ultrasonic transducer cell 10 and the second ultrasonic transducer cell 20 during an ultrasonic transmission operation.

In an embodiment, external ultrasonic waves may be received in a state where a DC voltage is applied to the second ultrasonic transducer cell 20. An ultrasonic reception principle of the second ultrasonic transducer cell 20 will be described hereinafter in detail. When the external ultrasonic waves are applied in the state where a DC voltage is applied between the third and fourth electrodes 65 and 70 of the second ultrasonic transducer cell 20, the external ultrasonic waves displaces the second thin film 50. The displacement of the second thin film 50 may vary according to sound pressure of the external ultrasonic waves, and electrostatic capacitance of the second ultrasonic transducer cell 20 may vary according to the displacement of the second thin film 50. The external ultrasonic waves may be received based on the changes in the electrostatic capacitance of the second ultrasonic transducer cell 20.

When the second ultrasonic transducer cell 20 receives external ultrasonic waves, the first thin film 40 of the first ultrasonic transducer cell 10 may be deformed, and thereby decreases ultrasonic reception sensitivity of the second ultrasonic transducer cell 20. In an embodiment, the decrease in the ultrasonic reception sensitivity is effectively prevented by applying a DC voltage greater than a collapse mode voltage to the first ultrasonic transducer cell 10, which reduces the deformation of the first thin film 40. In a collapse mode, an electrostatic force and deformation of a thin film are balanced and displacement of the thin film corresponds to about one-third of an electrode gap, and thereby provides substantially high ultrasonic transmission power. However, since the collapse mode may lead to a severe change in characteristics, reliability may be poor.

Figure 9:
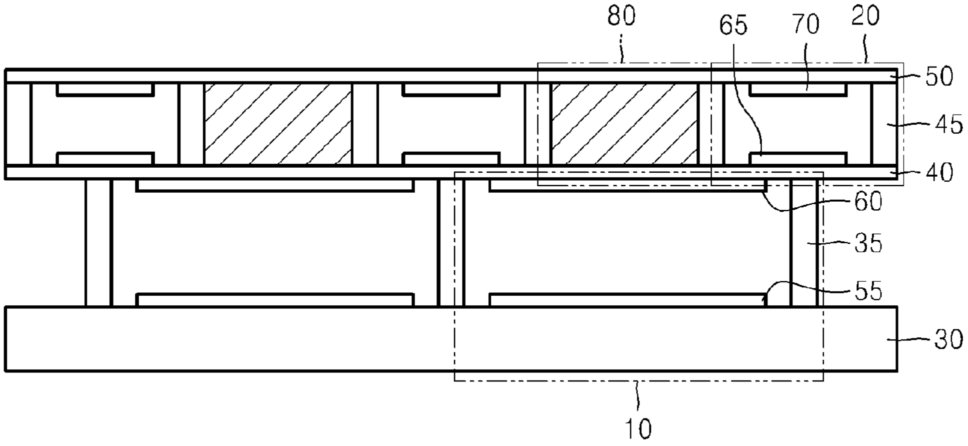
FIG. 9 is a cross-sectional view of an embodiment of an ultrasonic transducer including an oscillation amplifying unit.

FIG. 9 is a cross-sectional view of an embodiment of the ultrasonic transducer including an oscillation amplifying unit 80. Referring to FIG. 9, the oscillation amplifying unit 80 may be disposed in the second cavity 25 of the second ultrasonic transducer cell 20 that may be coupled with the thin film 40. When the oscillation amplifying unit 80 is disposed in the second cavity 25, the ultrasonic transmission power of the first ultrasonic transducer cell 10 is substantially increased. The oscillation amplifying unit 80 may oscillate together with the first thin film 40 and thereby amplifies the ultrasonic transmission power of the first ultrasonic transducer cell 10. In an embodiment, the oscillation amplifying unit 80 may be a filler type that may fill the second cavity 25 and oscillate together with the first thin film 40 to amplify the ultrasonic transmission power of the first ultrasonic transducer cell 10.

Figure 10:
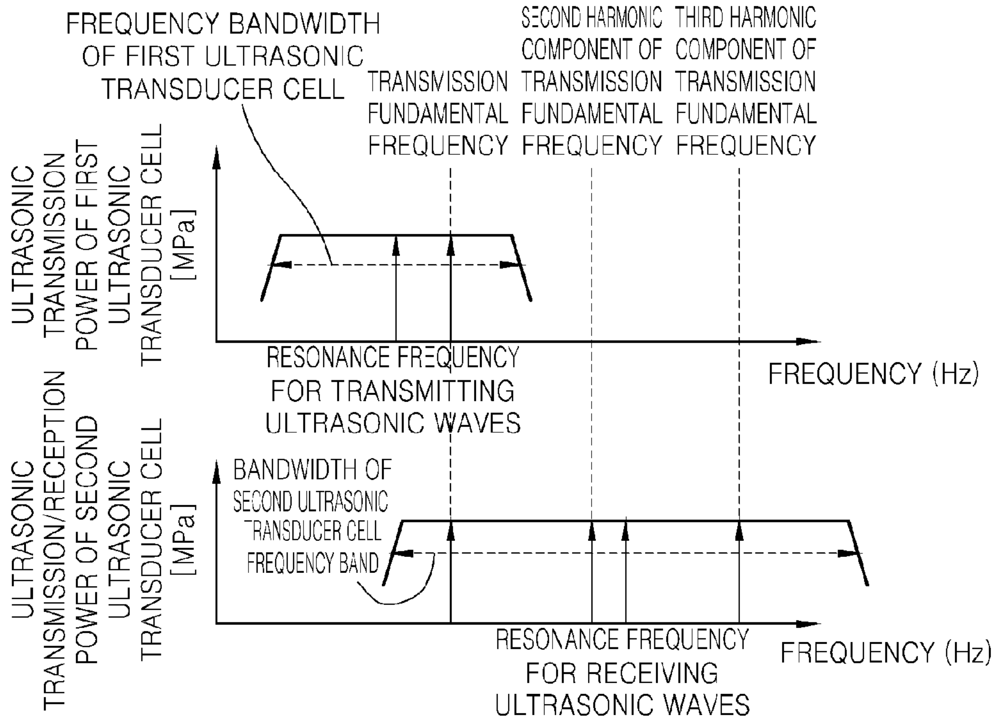
FIG. 10 illustrates graphs of ultrasonic transmission power versus frequency illustrating frequency bands of first and second ultrasonic transducer cells of an embodiment of an ultrasonic transducer.

FIG. 10 illustrates graphs of ultrasonic transmission power, in MPa, versus frequency, in Hz, illustrating frequency bands of the first and second ultrasonic transducer cells 10 and 20 of an embodiment of the ultrasonic transducer. Referring to FIG. 10, a resonance frequency of the first ultrasonic transducer cell 10 may be a first transmission fundamental frequency, and a resonance frequency of the second ultrasonic transducer cell 20 may be a harmonic component of the first transmission fundamental frequency. In an embodiment, the resonance frequency of the second ultrasonic transducer cell 20 may be substantially equal to the resonance frequency of the first ultrasonic transducer cell 10. In another embodiment, the resonance frequency of the second ultrasonic transducer cell 20 may be higher than the resonance frequency of the first ultrasonic transducer cell 10, e.g., the resonance frequency of the second ultrasonic transducer cell 20 may be twice or three times higher than the resonance frequency of the first ultrasonic transducer cell 10. At least a portion of the frequency band of the second ultrasonic transducer cell 20 may be included in the frequency band of the first ultrasonic transducer cell 10. The frequency band of the first ultrasonic transducer cell 10 may include a transmission fundamental frequency. The frequency band of the second ultrasonic transducer cell 20 may include the transmission fundamental frequency or harmonic components of the transmission fundamental frequency. As shown in FIG. 10, the frequency band of the second ultrasonic transducer cell 20 includes the transmission fundamental frequency and second and third harmonic components of the first transmission fundamental frequency. When a resonance frequency of an ultrasonic transducer cell increases, resolution of an ultrasonic image increases and a viewing distance of the ultrasonic image decreases. Accordingly, the resonance frequency of the first ultrasonic transducer cell 10 that transmits ultrasonic waves may be a low frequency and the resonance frequency of the second ultrasonic transducer cell 20 that receives ultrasonic waves may be a high frequency.

Figure 3:
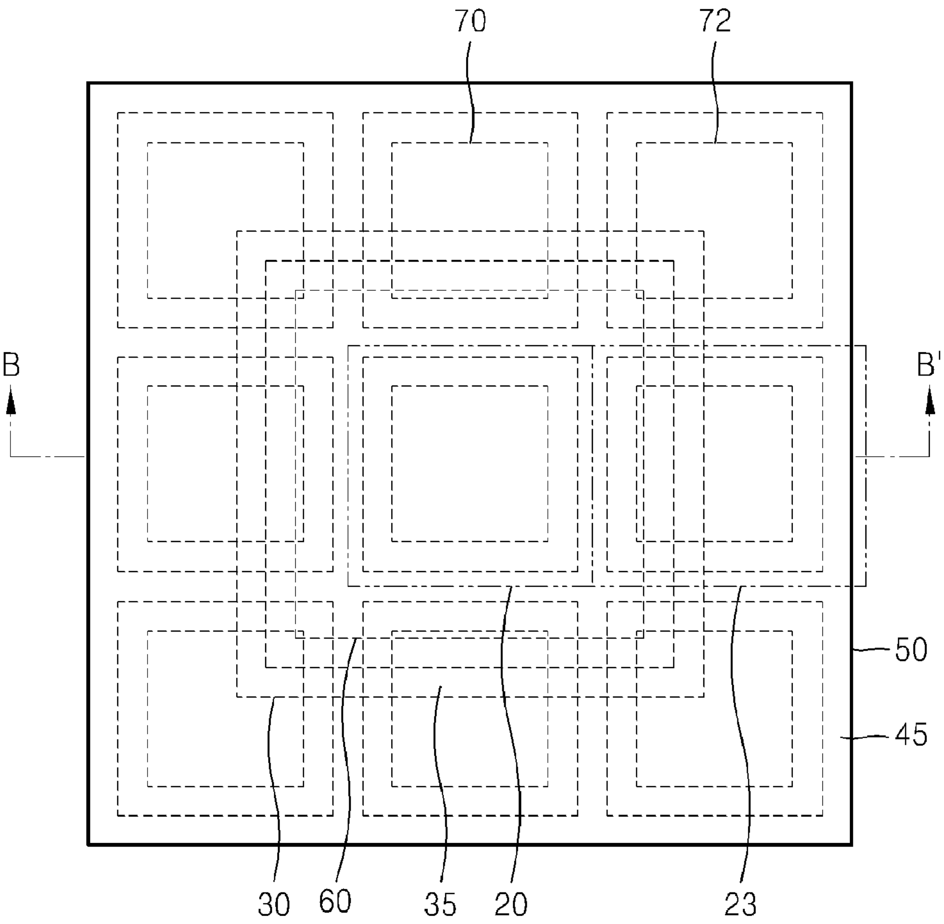
FIG. 3 is a plan view of another embodiment of an ultrasonic transducer.

FIG. 3 is a plan view of another embodiment of an ultrasonic transducer. As shown in FIG. 3, the ultrasonic transducer further include at least one third ultrasonic transducer cell 23 disposed on the first support portion 35 and adjacent to the second support portion 45. In an embodiment the at least one third ultrasonic transducer cell 23 may surround the second ultrasonic transducer cell 20. The first ultrasonic transducer cell 10 may transmit ultrasonic waves, and the second and third ultrasonic transducer cells 20 and 23 may both transmit and receive ultrasonic waves. The first and second ultrasonic transducer cells 10 and 20 in FIG. 3 is substantially the same as the first and second ultrasonic transducer cells 10 and 20 shown in FIG. 1, and any repetitive detailed description thereof will hereinafter be omitted or simplified.

Figure 4:
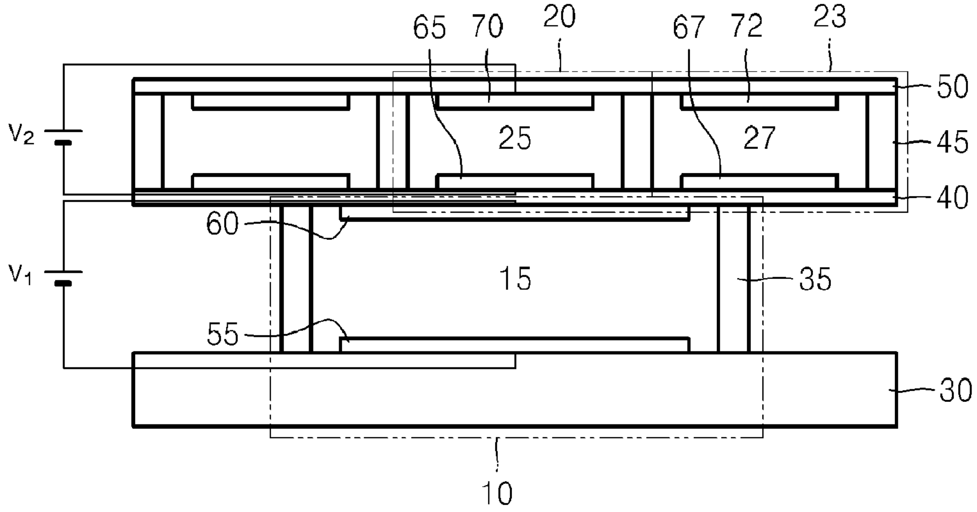
FIG. 4 is a cross-sectional view taken along line B-B' of FIG. 3.

FIG. 4 is a cross-sectional view taken along line B-B' of FIG. 3. As shown in FIG. 4, the third ultrasonic transducer cell 23 may include a first thin film 40, a second thin film 50 and a third cavity 27 formed between the first thin film 40 and the second thin film 50. A second support portion 45 may be disposed between the first thin film 40 of the third ultrasonic transducer cell 23 and the second thin film 50 of the third ultrasonic transducer cell, e.g., provided as a side wall of the third cavity 27. In an embodiment, the second and third ultrasonic transducer cells 20 and 23 may share the second support portion 45. The first thin film 40 and the second support portion 45 may be integrally formed with each other, or the second thin film 50 and the second support portion 45 may be integrally formed with each other. In an embodiment, the third ultrasonic transducer cell 23 may be disposed on the first thin film 40 or the second thin film 50. The first, second, and third ultrasonic transducer cells 10, 20 and 23 may share the first thin film 40. The first thin film 40 may have two-layers included in the first and third transducer cells 10 and 23, respectively. A fifth electrode 67 may be disposed on, e.g., over or below, the first thin film 40 and a sixth electrode 72 may be disposed on, e.g., over or below, the second thin film 50. As shown in FIG. 4, a first voltage $V_1$ may be applied between the first electrode 55 and the second electrode 60, and a second voltage $V_2$ may be applied between the third electrode 65 and the fourth electrode 70. The second voltage $V_2$ may also be applied between the fifth electrode 67 and the sixth electrode 72. In an embodiment, the second electrode 60 and the third electrode 65 may be used as common ground electrodes. In another embodiment, the second electrode 60 and the fifth electrode 67 may also be used as common ground electrodes. An insulating layer may be disposed between the second electrode 60 and the fifth electrode 67. The third cavity 27 may have an electrode gap between the fifth electrode 67 and the sixth electrode 72. The electrode gap of the third cavity 27 may be predetermined to thereby increase ultrasonic reception sensitivity. In an embodiment, when the third ultrasonic transducer cell receives ultrasonic waves and the first ultrasonic transducer cell transmits ultrasonic waves, the electrode gap of the third cavity 27 that receives ultrasonic waves may be less than the electrode gap of the first cavity 15 that transmits ultrasonic waves. The area of horizontal cross-section of the first cavity 25 may be greater than an area of horizontal cross-section of the third cavity 27. In an embodiment, the ultrasonic transducer may have a two-layer structure in which the third ultrasonic transducer cell 23 is disposed, e.g., stacked, on the first ultrasonic transducer cell 10. In another embodiment, the third ultrasonic transducer cell 23 may be disposed on the first ultrasonic transducer cell 10 and overlapping the first support portion 35 of the first ultrasonic transducer cell 10. A shape of the third cavity 27, in horizontal cross-section, may be a rectangle, e.g., a square, as shown in FIG. 3, but is not limited thereto. In another embodiment, the shape of the third cavity 27, in horizontal cross-section, may be, for example, a circle, a hexagon or and octagon.

When AC voltages are applied to the first and second ultrasonic transducer cells 10 and 20 in the state where DC voltages are applied to the first and second ultrasonic transducer cells 10 and 20, ultrasonic waves are transmitted. When AC voltages are applied to the first, second and third ultrasonic transducer cells 10, 20 and 23 in the state where DC voltages are applied to the first through third ultrasonic transducer cells 10, 20, and 23, ultrasonic waves may be transmitted. When DC or AC voltages are applied to the first through third ultrasonic transducer cells 10, 20, and 23, the voltage applied to the first ultrasonic transducer cell 10 may be greater than either of the voltages applied to the second and third ultrasonic transducer cells 20 and 23. An ultrasonic transmission principle of the first through third ultrasonic transducer cells 10, 20 and 23 is substantially the same as the ultrasonic transmission principles described above. In an embodiment, the ultrasonic transmission power of the first ultrasonic transducer cell 10 and the ultrasonic transmission power of the second ultrasonic transducer cell 20 may be summed up because the second ultrasonic transducer cell 20 is coupled with the first ultrasonic transducer cell 10 and oscillate together, and thus, the ultrasonic transmission power of the ultrasonic transducer is substantially increased. When the first thin film 40 oscillates, since the third ultrasonic transducer cell 23 overlapping the first support portion 35 is supported by the first support portion 35, the third ultrasonic transducer cell 23 is substantially less affected by the oscillation of the first thin film 40. Even when ultrasonic waves are transmitted by applying an AC voltage in the state where a DC voltage is applied to the first ultrasonic transducer cell 10, since the second ultrasonic transducer cell 20 may be coupled with the first ultrasonic transducer cell 10 and oscillate together, the ultrasonic transmission power of the ultrasonic transducer including both the first and second ultrasonic transducer cells 10 and 20 may be higher than the ultrasonic transmission power of an ultrasonic transducer including the first ultrasonic transducer cell 10 only.

External ultrasonic waves may be received in the state where DC voltages are applied to the second and third ultrasonic transducer cells 20 and 23. An ultrasonic reception principle of the second and third ultrasonic transducer cells 20 and 23 is substantially the same as the ultrasonic reception principle described above. In an embodiment, when the second and third ultrasonic transducer cells 20 and 23 receive external ultrasonic waves, the first thin film 40 of the first ultrasonic transducer cell 10 may be deformed, and the reception sensitivity of the ultrasonic transducer may be thereby substantially decreased. However, since only the second ultrasonic transducer cell 20 is affected by the deformation of the first thin film 40 and the third ultrasonic transducer cell 23 is substantially less affected by the deformation of the first thin film 40 as described above, the decrease in the overall ultrasonic reception sensitivity of the second and third ultrasonic transducer cells 20 and 23 that receive ultrasonic waves by the deformation of the first thin film 40 is effectively prevented. In an embodiment, the decrease in the ultrasonic reception sensitivity is effectively prevented by applying a DC voltage greater than a collapse mode voltage to the first ultrasonic transducer cell 10 to reduce the deformation of the first thin film 40.

Referring again to FIG. 9, the oscillation amplifying unit 80 may be disposed in the second cavity 25 of the second ultrasonic transducer cell 20, which may be coupled with the first ultrasonic transducer 10. When the oscillation amplifying unit 80 is disposed in the second cavity 25, the ultrasonic transmission power of the first ultrasonic transducer cell 10 is substantially increased. In an embodiment, similarly to the principle of increasing power of a speaker by installing the oscillation amplifying unit 80 in an oscillating membrane of the speaker, the oscillation amplifying unit 80 may oscillate together with the first thin film 40 to amplify the ultrasonic transmission power of the first ultrasonic transducer cell 10. In an embodiment, the oscillation amplifying unit 80 may be a filler type that may fill the second cavity 25 that may fill the second cavity 25 and oscillate together with the first thin film 40 to amplify the ultrasonic transmission power of the first ultrasonic transducer cell 10. In another embodiment, a support portion, instead of the second cavity 25 including the oscillation amplifying unit 80, may be disposed on the first cavity 15. That is, the third ultrasonic transducer cell 23 may be disposed on the first thin film 40 overlapping the first support portion 35 to be supported by the first support portion 35 and, without the second ultrasonic transducer cell 20, the second support portion 45 may be disposed between third ultrasonic transducer cells 23 adjacent to each other. In an embodiment, when the second support portion 45 disposed on the first cavity 15 may oscillate together with the first thin film 40 instead of the second ultrasonic transducer cell 20, the ultrasonic transmission power of the first ultrasonic transducer cell 10 is substantially increased.

Referring again to FIG. 10, the resonance frequency of the first ultrasonic transducer cell 10 may be a first transmission fundamental frequency, and the resonance frequency of the second ultrasonic transducer cell 20 may be a harmonic component of the first transmission fundamental frequency. In an embodiment, the resonance frequency of the second ultrasonic transducer cell 20 may be one of substantially equal to a resonance frequency of the first ultrasonic transducer cell 10, twice higher than the resonance frequency of the first ultrasonic transducer cell 10 and three times higher than the resonance frequency of the first ultrasonic transducer cell 10. The resonance frequency of the second ultrasonic transducer cell 20 may be higher than the resonance frequency of the first ultrasonic transducer cell 10. At least a portion of the frequency band of the second ultrasonic transducer cell 20 may be included in the frequency band of the first ultrasonic transducer cell 10. The frequency band of the first ultrasonic transducer cell 10 may include the first transmission fundamental frequency. The frequency band of the second ultrasonic transducer cell 20 may include the first transmission fundamental frequency and the harmonic components of the first transmission fundamental frequency. As shown in FIG. 10, the frequency band of the second ultrasonic transducer cell 20 includes the first transmission fundamental frequency and second and third harmonic components of the first transmission fundamental frequency. When a resonance frequency for an ultrasonic transducer cell increases, resolution of an ultrasonic image increases and a viewing distance of the ultrasonic image decreases. Accordingly, the resonance frequency of the first ultrasonic transducer cell 10 that transmits ultrasonic waves may be a low frequency and the resonance frequencies of the second and third ultrasonic transducer cells 20 and 23 that receive ultrasonic waves may be high frequencies.

Figure 5:
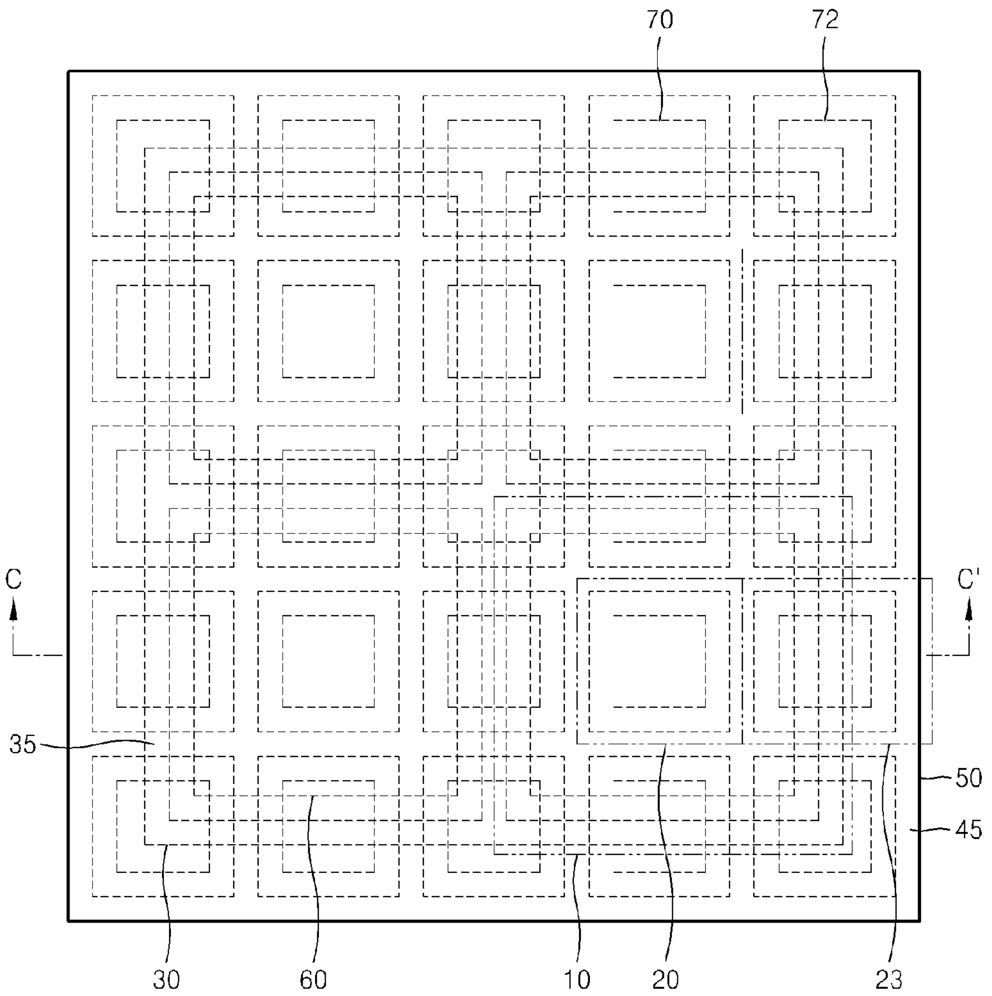
FIG. 5 is a plan view of yet another embodiment of an the ultrasonic transducer.
Figure 6:
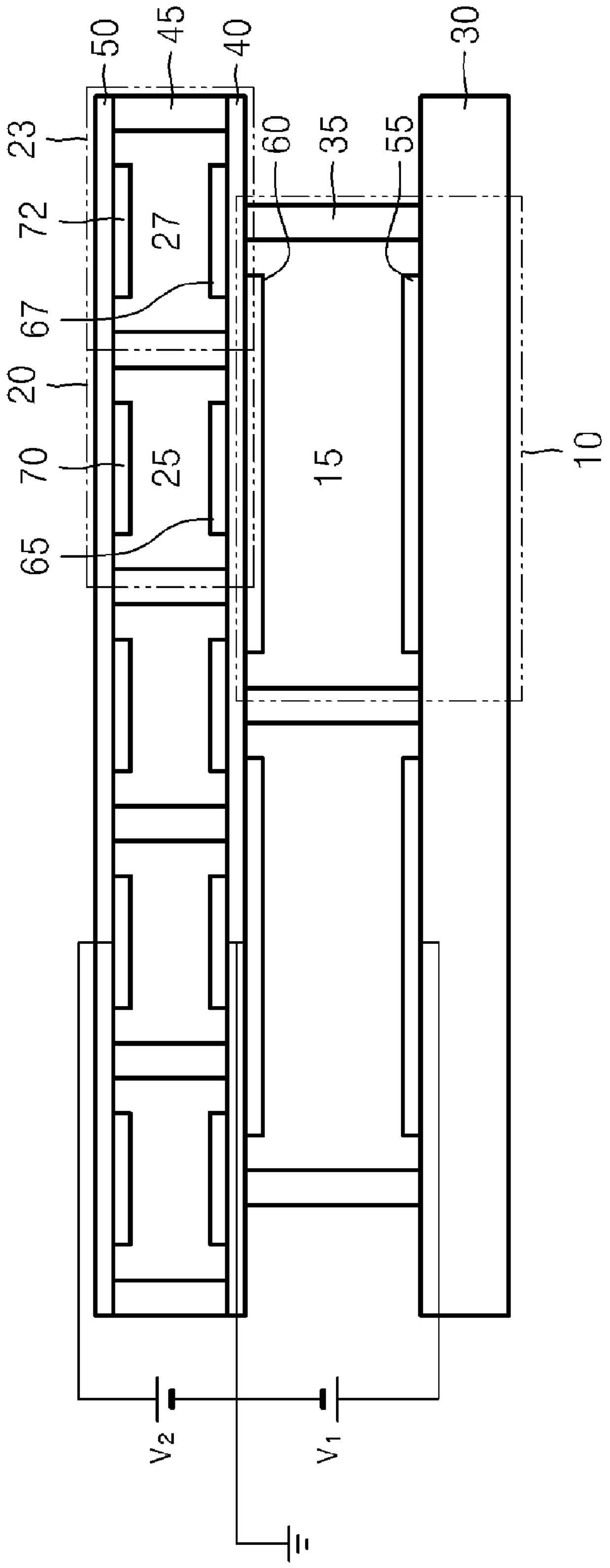
FIG. 6 is a cross-sectional view taken along line C-C' of FIG. 5.

FIG. 5 is a plan view of another embodiment of an ultrasonic transducer. Referring to FIG. 5, a 5×5 array of second and third ultrasonic transducer cells 20 and 23 are disposed on a 2×2 array of first ultrasonic transducer cell 10. In another embodiment, the ultrasonic transducer including the first, second and third ultrasonic transducer cells 10, 20, and 23 is not limited to the arrangement of the 2×2 and 5×5 arrays of ultrasonic transducer cells, and may include various arrangement of transducer cells including n×m array, for example (n and m are natural numbers greater than 1). FIG. 6 is a cross-sectional view taken along line C-C' of the ultrasonic transducer of FIG. 5. Referring to FIG. 6, the ultrasonic transducer includes a substrate 30 on which at least one first support portion 35 is disposed, a first thin film 40 disposed on the first support portion 35, at least one first cavity 15 formed between the substrate 30 and the first thin film 40, at least one second support portion 45 disposed on the first thin film 40, a second thin film 50 disposed on the second support portion 45, and at least one second cavity 25 formed between the first thin film 40 and the second thin film 50. The first cavity 15 may be defined by a space surrounded by the substrate 30, the first thin film 40 and the first support portion 35. The substrate 30 and the first support portion 35 may be integrally formed with each other, or the first thin film 40 and the first support portion 35 may be integrally formed with each other. The first cavity 15 may be disposed between the substrate 30 and the first thin film 40. The first cavity 15 may be used to transmit ultrasonic waves. A first electrode 55 may be disposed on, e.g., above or below, the substrate 30, and a second electrode 60 may be disposed on, e.g., above or below, the first thin film 40. The first cavity 15 may have an electrode gap between the first electrode 55 and the second electrode 60. The electrode gap of the first cavity 15 may be predetermined to thereby increase ultrasonic transmission power. A shape of each of the first and second cavities 15 and 25, in horizontal cross-section, may be a square as shown in FIG. 5, but not being limited thereto. In another embodiment, the shape of the each of the first and second cavities 15 and 25, in horizontal cross-section, may be, for example, a circle, hexagon or octagon.

The second cavity 25 may be defined by a space surrounded by the first thin film 40, the second thin film 50 and the second support portion 45. The first thin film 40 and the second support portion 45 may be integrally formed with each other, or the second thin film 50 and the second support portion 45 may be integrally formed with each other. The second cavity 25 may be disposed between the first thin film 40 and the second thin film 50. The second cavity 25 may be a cavity used to receive ultrasonic waves. The second cavity 25 may also be used to transmit ultrasonic waves. A third electrode 65 may be disposed on, e.g., above or below, the first thin film 40, and a fourth electrode 70 may be disposed on, e.g., above or below, the second thin film 50. As shown in FIG. 6, a first voltage $V_1$ may be applied between the first electrode 55 and the second electrode 60, and a second voltage $V_2$ may be applied between the third electrode 65 and the fourth electrode 70. The second electrode 60 and the third electrode 65 may be used as common ground electrodes. An insulating layer may be disposed between the second electrode 60 and the third electrode 65. The second cavity 25 may have an electrode gap between the third electrode 65 and the fourth electrode 70. The electrode gap of the second cavity 25 may be predetermined to thereby increase ultrasonic reception sensitivity. In an embodiment, the electrode gap of the second cavity 25 that receives ultrasonic waves may be less than the electrode gap of the first cavity 15 that transmits ultrasonic waves. At least one of a plurality of second cavities 25 may be disposed on the first thin film 45 overlapping the first cavity 15 and not overlapping the first support portion 35.

Figure 8:
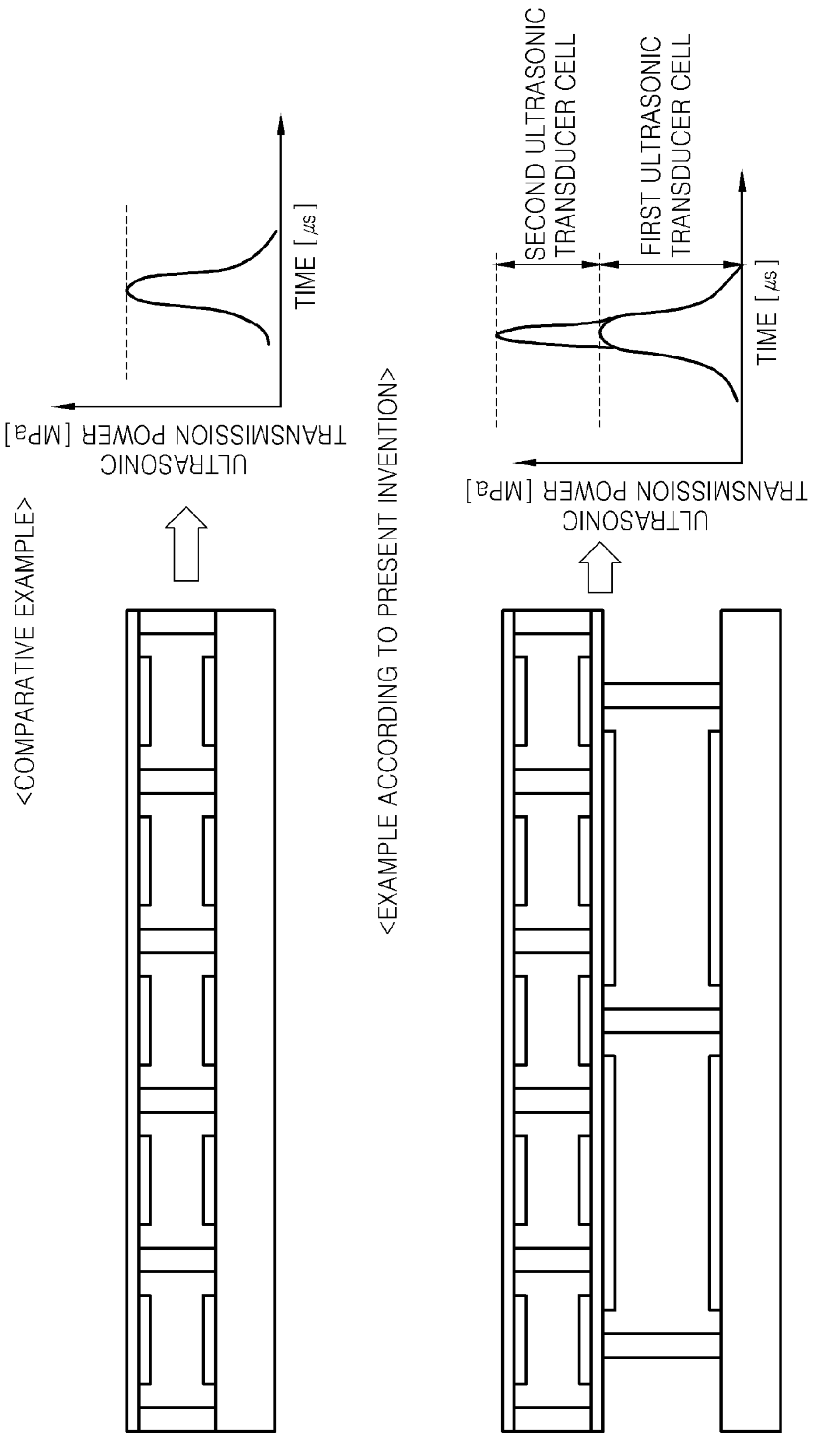
FIG. 8 illustrates cross-sectional views, and accompanying graphs of transmission power versus time, for a comparative example of an ultrasonic transducer and an example embodiment of an ultrasonic transducer.

When AC voltages are applied to the first and second cavities 145 and 25 in the state where DC voltages are applied to the first and second cavities 15 and 25, ultrasonic waves are transmitted. When DC or AC voltages are applied to the first and second cavities 15 and 25, the voltage applied to the first cavity 15 may be greater than the voltage applied to the second cavity 25. An ultrasonic transmission principle of the first cavity 15 will be described hereinafter in detail. When a DC voltage is applied between the first and second electrodes 55 and 60, the substrate 30 and the first thin film 40 form a capacitor. When the DC voltage is applied between the first electrode 55 and the second electrode 60, the first thin film 40 is displaced due to an electrostatic force attracting the second electrode 60 and the first electrode 55 toward each other. The first thin film 40 is displaced to a position where the electrostatic force and the internal stress in the first thin film 40 are equal to each other. When an AC voltage is applied in the state, the first thin film 40 oscillates, and the first cavity 15 thereby generates ultrasonic waves. An ultrasonic transmission principle of the second cavity 25 is substantially the same as the ultrasonic transmission principle of the first cavity 15. In an embodiment, ultrasonic transmission power of the first cavity 15 and ultrasonic transmission power of the second cavity 25 may be summed up because the second cavity 25 may be coupled with the first cavity 15 and oscillate together, ultrasonic transmission power of the ultrasonic transducer may be substantially increased. FIG. 8 illustrates cross-sectional views, and accompanying graphs of transmission power versus time, for a comparative example of an ultrasonic transducer and an example embodiment of an ultrasonic transducer. More particularly, FIG. 8 includes graphs of ultrasonic transmission power, in Mpa, versus time, in μs, of a one-layer ultrasonic transducer including an ultrasonic transducer cell that both transmits and receives ultrasonic waves and a two-layer structured ultrasonic transducer including first and second cavities 15 and 25 that may be coupled with each other and oscillate together. The ultrasonic transmission power of the two-layer structured ultrasonic transducer according to the present invention is higher than the ultrasonic transmission power of the one-layer ultrasonic transducer because the ultrasonic transmission power of the second cavity 25 is added to the ultrasonic transmission power of the first cavity 15 and the second cavity 25 and the first cavity 15 are coupled with and oscillate together. When ultrasonic waves are transmitted by applying an AC voltage in the state where a DC voltage is applied to the first cavity 15, since the second cavity 25 may be coupled with the first cavity 15 and oscillate together, the ultrasonic transmission power of the ultrasonic transducer including the first and second cavities 15 and 25 may be higher than the ultrasonic transmission power of the ultrasonic transducer including only the first cavity 15.

Figure 7:
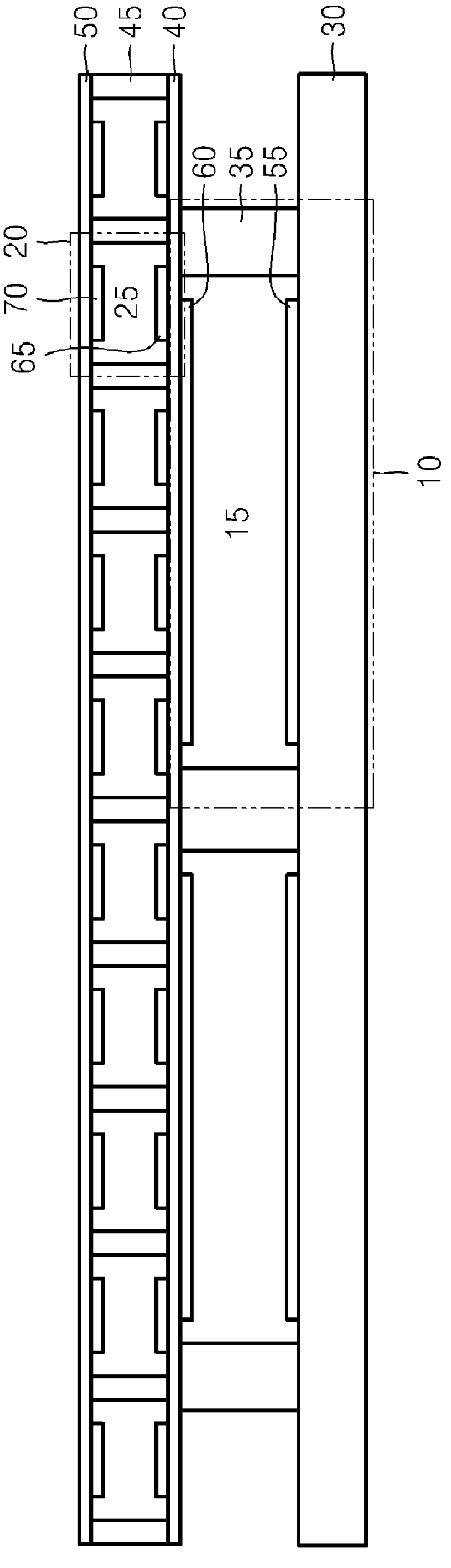
FIG. 7 is a cross-sectional view of still another embodiment of an ultrasonic transducer.

External ultrasonic waves may be received in the state where a DC voltage is applied to the second cavity 25. An ultrasonic reception principle of the second cavity 25 will hereinafter be described in further detail. When external ultrasonic waves are applied in the state where a DC voltage is applied between the third and fourth electrodes 65 and 70 to displace the second thin film 50, the displacement of the second thin film 50 may vary according to the sound pressure of the external ultrasonic waves. Electrostatic capacitance of the second cavity 25 may vary according to the displacement of the second thin film 50. The external ultrasonic waves may be received by detecting the change in the electrostatic capacitance. When the second cavity 25 receives external ultrasonic waves, the first thin film 40 of the first cavity 15 may be deformed, and the ultrasonic reception sensitivity is thereby decreased. Since only some cavities 25 of the plurality of cavities 25 are affected by the deformation of the first thin film 40, the overall ultrasonic reception sensitivity of the second cavities 25 that receive ultrasonic waves is not affected so much by the deformation of the first thin film 40. In another embodiment, the decrease in the ultrasonic reception sensitivity may be effectively prevented by applying a DC voltage greater than a collapse mode voltage to the first cavity 15 to reduce the deformation of the first thin film 40. A collapse mode refers to a mode when an electrostatic force and deformation of a thin film are balanced and displacement of the thin film corresponds to one-third of an electrode gap, and which provides substantially high ultrasonic transmission power. However, since a collapse mode leads to a severe change in characteristics, reliability may be poor. Size of the second cavity 25 disposed on the first thin film 40 and number of the second cavities 25 may be determined to thereby increase ultrasonic reception sensitivity. Ultrasonic reception sensitivity may be increased by reducing the each area of the second cavities 25 disposed on the first thin film 40 and increase the number of the second cavities 25. FIG. 7 is a cross-sectional view of another embodiment of the ultrasonic transducer. Referring to FIG. 7, to increase ultrasonic reception sensitivity, for example, an array of 10×10 second cavities 25 are disposed over an array of 2×2 first cavities 15.

Referring again to FIG. 9, the oscillation amplifying unit 80 may be provided in the second cavity 25 that may be coupled with the first thin film 40 and oscillate together. Since the oscillation amplifying unit 80 is provided in the second cavity 25, the ultrasonic transmission power of the first cavity 15 may be increased. In an embodiment, similarly to the principle of increasing power of a speaker by installing the oscillation amplifying unit 80 in an oscillating membrane of the speaker, the oscillation amplifying unit 80 may oscillate together with the first thin film 40, and the ultrasonic transmission power of the first cavity 15 is thereby amplified. In an embodiment, the oscillation amplifying unit 80 may be a filler type that fills the second cavity 25 and oscillate together with the first thin film 40 to amplify the ultrasonic transmission power of the first cavity 15. In another embodiment, a support portion, instead of the second cavity 25 including the oscillation amplifying unit 80, may be disposed on the first cavity 15. That is, the second cavity 25 may be disposed on the first thin film 40 overlapping the first support portion 35 to be supported by the first support portion 35, and the second support portion 45 may be disposed between second cavities 25 adjacent to each other on the first cavity 15. In an embodiment, when the second support portion 45, instead of the second cavity 25, may oscillate together with the first thin film 40, the ultrasonic transmission power of the first cavity 15 is substantially increased.

Referring again to FIG. 10, the resonance frequency of the first thin film 40 may be a first transmission fundamental frequency, and the resonance frequency of the second thin film 50 may be the harmonic component of the first transmission fundamental frequency. In an embodiment, the resonance frequency of the second thin film 50 may one of substantially equal to a resonance frequency of the first ultrasonic transducer cell 10, twice higher than the resonance frequency of the first ultrasonic transducer cell 10 and three times higher than the resonance frequency of the first thin film 40. The resonance frequency of the second ultrasonic transducer cell 20 may be higher than the resonance frequency of the first ultrasonic transducer cell 10. At least a portion of the frequency band of the second ultrasonic transducer cell 20 may be included in the frequency band of the first ultrasonic transducer cell 10. The frequency band of the first ultrasonic transducer cell 10 may include the first transmission fundamental frequency. The frequency band of the second ultrasonic transducer cell 20 may include the first transmission fundamental frequency and the harmonic components of the first transmission fundamental frequency. As shown in FIG. 10, the frequency band of the second ultrasonic transducer cell 20 includes the first transmission fundamental frequency and second and third harmonic components of the first transmission fundamental frequency. When a resonance frequency for an ultrasonic transducer cell increases, resolution of an ultrasonic image increases and a viewing distance of the ultrasonic image decreases, the resonance frequency of the first thin film 40 that transmits ultrasonic waves may be a low frequency and the resonance frequency of the second thin film 50 that receives ultrasonic waves may be a high frequency.

The general inventive concept should not be construed as being limited to the embodiments set forth herein. Rather, these example embodiments are provided so that this disclosure will be thorough and complete and will fully convey the concept of the present invention to those skilled in the art.

While the present invention has been particularly shown and described with reference to example embodiments thereof, it will be understood by those of ordinary skill in the art that various changes in form and details may be made therein without departing from the spirit or scope of the present invention as defined by the following claims.

What is claimed is:

1. An ultrasonic transducer comprising:
- a first ultrasonic transducer cell; and
- at least one second ultrasonic transducer cell disposed on the first ultrasonic transducer cell,
- wherein the at least one second ultrasonic transducer cell oscillates together with the first ultrasonic transducer cell, and
- wherein the first ultrasonic transducer cell comprises:
  - a substrate;
  - a first thin film disposed opposite the substrate;
  - a first support portion disposed between the substrate and the first thin film;
  - a first cavity formed between the substrate and the first thin film; and
  - electrodes for applying voltage to the first ultrasonic transducer cell.

2. The ultrasonic transducer of claim 1, wherein an area of a horizontal cross-section of the at least one second ultrasonic transducer cell is less than an area of a horizontal cross-section of the first ultrasonic transducer cell.

3. The ultrasonic transducer of claim 1, wherein the at least one second ultrasonic transducer cell comprises:
- a second thin film disposed opposite the first thin film of the first ultrasonic transducer cell;
- a second support portion disposed between the first thin film of the first ultrasonic transducer cell and the second thin film; and
- a second cavity formed between the first thin film of the first ultrasonic transducer cell and the second thin film.

4. The ultrasonic transducer of claim 1, wherein the at least one second ultrasonic transducer cell is disposed on the first thin film of the first ultrasonic transducer cell and not overlapping the first support portion.

5. The ultrasonic transducer of claim 3, further comprising:
- at least one third ultrasonic transducer cell disposed adjacent to the at least one second ultrasonic transducer cell; and
- a third cavity formed in the at least one third ultrasonic transducer cell,
- wherein the at least one third ultrasonic transducer cell is disposed on the first thin film of the first ultrasonic transducer cell and overlapping the first support portion.

6. The ultrasonic transducer of claim 5, wherein
- the first cavity is used to transmit ultrasonic waves, and
- the second cavity and the third cavity are used to transmit and receive ultrasonic waves.

7. The ultrasonic transducer of claim 1, wherein the first ultrasonic transducer cell and the at least one second ultrasonic transducer cell transmit ultrasonic waves when alternating current voltages are applied to the electrodes of the first ultrasonic transducer cell and electrodes of the second ultrasonic transducer cell in a state where the electrodes of the first ultrasonic transducer cell and the at least one second ultrasonic transducer cell receive direct current voltages.

8. The ultrasonic transducer of claim 5, wherein ultrasonic waves are received by the at least one second ultrasonic transducer cell and the at least one third ultrasonic transducer cell when a direct current voltage is applied to electrodes of the at least one second ultrasonic transducer cell and the at least one third ultrasonic transducer cell.

9. The ultrasonic transducer of claim 1, wherein, when voltages are applied to the electrodes of the first ultrasonic transducer cell and electrodes of the at least one second ultrasonic transducer cell, a voltage applied to the electrodes of the first ultrasonic transducer cell is greater than a voltage applied to the electrodes of the at least one second ultrasonic transducer cell.

10. The ultrasonic transducer of claim 8, wherein the at least one second ultrasonic transducer cell and the at least one third ultrasonic transducer cell receive ultrasonic waves when a direct current voltage greater than a collapse mode voltage is applied to the electrodes of the first ultrasonic transducer cell.

11. The ultrasonic transducer of claim 3, further comprising
- an oscillation amplifying unit disposed in the second cavity,
- wherein the oscillation amplifying unit oscillates together with the first thin film of the at least one second ultrasonic transducer cell when ultrasonic waves are transmitted.

12. The ultrasonic transducer of claim 1, wherein
- a resonance frequency of the at least one second ultrasonic transducer cell is higher than a resonance frequency of the first ultrasonic transducer cell, and
- at least a portion of a frequency band of the at least one second ultrasonic transducer cell is included in a frequency band of the first ultrasonic transducer cell.

13. The ultrasonic transducer of claim 1, wherein a resonance frequency of the at least one second ultrasonic transducer cell is one of substantially the same as a resonance frequency of the first ultrasonic transducer cell, twice higher than the resonance frequency of the first ultrasonic transducer cell and three times higher than the resonance frequency of the first ultrasonic transducer cell.

14. An ultrasonic transducer comprising:
- a substrate;
- a first thin film disposed opposite the substrate;
- a plurality of first support portions disposed between the substrate and the first thin film;
- a plurality of first cavities formed between the substrate and the first thin film;
- a second thin film disposed opposite the first thin film;
- a plurality of second support portions disposed between the first thin film and the second thin film; and
- a plurality of second cavities formed between the first thin film and the second thin film,
- wherein ultrasonic waves are transmitted when an alternating current voltage is applied in a state where direct current voltages are applied to electrodes at the plurality of first cavities and the plurality of second cavities.

15. The ultrasonic transducer of claim 14, wherein an area of horizontal cross-section of each second cavity of the plurality of second cavities is less than an area of horizontal cross-section of each first cavity of the plurality of first cavities.

16. The ultrasonic transducer of claim 14, wherein each second cavity of the plurality of second cavities transmits and receives ultrasonic waves.

17. The ultrasonic transducer of claim 14, wherein ultrasonic waves are received by the plurality of second cavities when a direct current voltage is applied to the electrodes at the plurality of second cavities.

18. The ultrasonic transducer of claim 14, wherein ultrasonic waves are received by the plurality of second cavities when a direct current voltage greater than a collapse mode voltage is applied to the electrodes at the plurality of first cavities.

19. The ultrasonic transducer of claim 14, wherein at least one second cavity of the plurality of second cavities overlaps the plurality of first cavities and does not overlap the plurality of first support portions.

20. The ultrasonic transducer of claim 14, further comprising an oscillation amplifying unit disposed in at least one second cavity of the plurality of second cavities and which oscillates together with the first thin film when ultrasonic waves are transmitted.

21. The ultrasonic transducer of claim 14, wherein the electrodes comprise:

a first electrode disposed above the substrate, a second electrode disposed below the first thin film, a third electrode disposed above the first thin film, a fourth electrode disposed below the second thin film, and the second electrode and the third electrode are common ground electrodes.

22. The ultrasonic transducer of claim 14, wherein, when voltages are applied to the electrodes at the plurality of first cavities and the plurality of second cavities, a voltage applied to the electrodes at each first cavity of the plurality of first cavities is greater than a voltage applied to the electrodes at each second cavity of the plurality of second cavities.

23. The ultrasonic transducer of claim 14, wherein a resonance frequency of the second thin film is higher than a resonance frequency of the first thin film, and at least a portion of a frequency band of the second thin film is included in a frequency band of the first thin film.

24. The ultrasonic transducer of claim 14, wherein a resonance frequency of the second thin film is one of substantially the same as a resonance frequency of the first thin film, twice higher than the resonance frequency of the first thin film and three times higher than the resonance frequency of the first thin film.

* * * * *